United States Patent
Biyabani et al.

(10) Patent No.: US 6,417,714 B1
(45) Date of Patent: Jul. 9, 2002

(54) METHOD AND APPARATUS FOR OBTAINING LINEAR CODE-DELAY RESPONSE FROM AREA-EFFICIENT DELAY CELLS

(75) Inventors: Ahmed Biyabani, Beaverton; Krishnamurthy Soumyanath, Portland, both of OR (US)

(73) Assignee: Inter Corporation, Santa Clara, CA (US)

( * ) Notice: Subject to any disclaimer, the term of this patent is extended or adjusted under 35 U.S.C. 154(b) by 0 days.

(21) Appl. No.: 09/539,732

(22) Filed: Mar. 30, 2000

(51) Int. Cl.[7] .............................................. H03H 11/26
(52) U.S. Cl. ....................... 327/278; 327/158; 327/161; 327/277
(58) Field of Search ................................. 327/155, 158, 327/159, 161, 269–272, 276–278

(56) References Cited

U.S. PATENT DOCUMENTS 5,336,940 A * 8/1994 Sorrells et al. ............. 327/276
5,355,037 A * 10/1994 Andresen et al. ........... 327/277
5,451,894 A * 9/1995 Guo ........................... 327/237
6,163,219 A * 12/2000 Kanasugi .................... 330/282

OTHER PUBLICATIONS

J. Christiansen, "An Integrated High Resolution CMOS Timing Generator Based on an Array of Delay Locked Loops," IEEE JSSC, vol. 31, No. 7, pp. 952–957, Jul. 1996.
B. Razavi, "A Study of Phase Noise in CMOS Oscillators," IEEE JSSC, vol. 31, No. 3, pp. 331–343, Mar. 1996.
Lance A. Glasser, Daniel W. Dobberpuhl, "The Design and Analysis of VLSI Circuits," Addison–Wesley Publishing Company, pp. 281–283, 1985.

* cited by examiner

Primary Examiner—Kenneth B. Wells
(74) Attorney, Agent, or Firm—Marger Johnson & McCollom

(57) ABSTRACT

An area-efficient delay cell utilizes transistor stacks to control positive feedback responsive to a counter code, thereby controlling the hysteresis and overall signal delay of the cell. The code-delay response of the cell can be modified by freezing the counter code at a convenient value. Linear superposition of the responses of one modified cell connected in series with one unmodified cell provides a more linear overall response and reduces jitter when used in a delay locked loop.

32 Claims, 4 Drawing Sheets

METHOD AND APPARATUS FOR OBTAINING LINEAR CODE-DELAY RESPONSE FROM AREA-EFFICIENT DELAY CELLS

BACKGROUND OF THE INVENTION

A common method of generating clock signals in high-frequency systems, including microprocessors systems operating in the GHz frequency range, is to use a phase-locked-loop (PLL) or a delay-locked-loop (DLL). A typical DLL employs a variable delay block in which the delay time depends on a digital code applied to the delay block. DLLs are simple to design using a digital design methodology, but they do not provide good range, and they are susceptible to different types of noise. One noise source is jitter in the least significant bit (LSB) of the digital code around the lock condition. The LSB itself might not be uniform across the range of operation. If, for example, the DLL is nearing lock at a frequency where the LSB is large, the associated jitter will also be large. Compounding this problem is jitter caused by power supply voltage (Vcc) variations—particularly bad at low power supply voltages.

FIG. 1 shows a typical prior art delay cell that is based on transistor gate capacitance loading in the signal path. The delay is controlled by the control signal C1 which connects the gate capacitance of MP2 to the signal path through MP1 when C1 is high. Such "RC" delay cells take up considerable die area, and are difficult to design for small (<100 ps) delays.

Frequently, a cascade of delay cells are used as the delay block. That is, a series of delay cells are arranged so that the output of each delay cell serves as the input to the next delay cell. FIG. 2 shows a prior art DLL in which the delay block includes a cascade of "n" delay cells such as those shown in FIG. 1. The delay cells are controlled by a digital code that is represented by code signals C1, C2, . . . Cn from a counter which is incremented and decremented by an up/down control signal from a phase detector. A problem with the circuit of FIG. 2, however, is that the jitter from each of the cells sums cumulatively.

DETAILED DESCRIPTION

Figure 3:
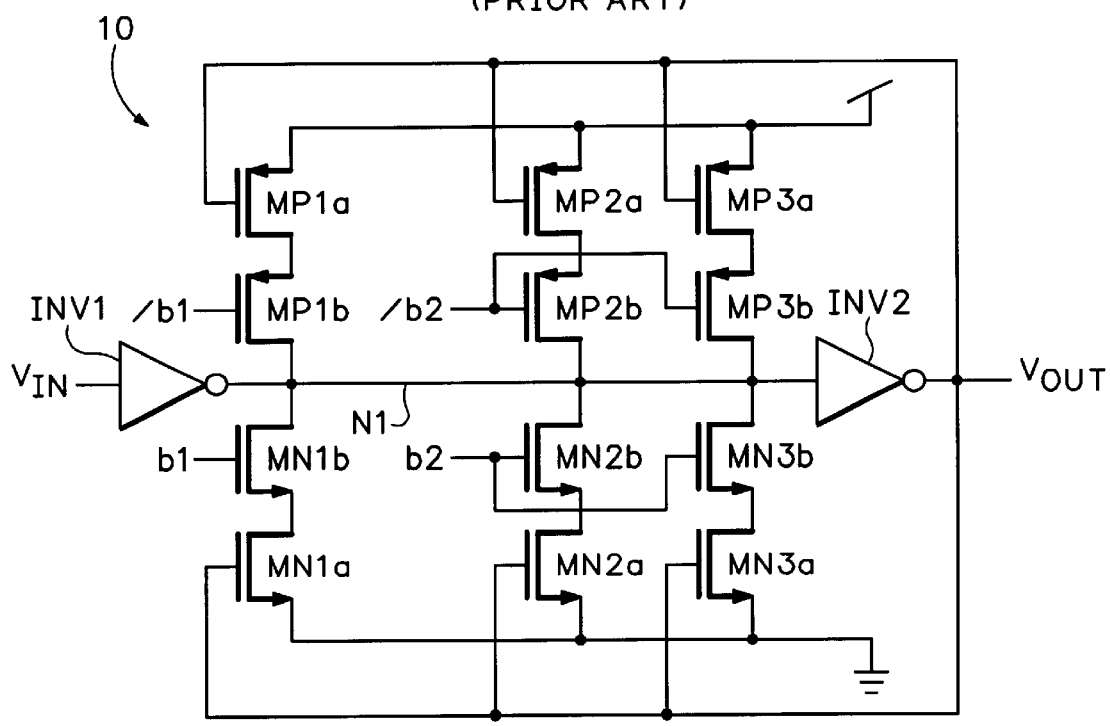
FIG. 3 is a schematic diagram of an embodiment of a delay cell constructed in accordance with the present invention.

FIG. 3 is a schematic diagram of an embodiment of a delay cell 10 constructed in accordance with the present invention. The circuit of FIG. 3 is adapted from a prior art circuit known as a regenerative comparator, which is commonly referred to as a Schmitt trigger. A Schmitt trigger employs positive (regenerative) feedback which causes some contention between the input and output of the circuit. This contention causes the circuit to exhibit hysteresis. For example, when the input signal is rising, it crosses a first trigger level that causes the output signal to switch to a low logic level. However, if the input signal falls back to the first trigger level, the output signal remains low because of the regenerative action of the positive feedback. The input signal must fall to a second trigger level that is lower then the first trigger level in order to overcome the positive feedback and cause the output to switch to a high logic level.

Prior art Schmitt triggers are designed to provide a predetermined amount of hysteresis. That is, the amount of contention between the input and output caused by the positive feedback is determined by the circuit design at the time the device is fabricated. Schmitt triggers are commonly used to eliminate chatter when converting slowly varying signals into signals having abrupt edges. They are also used to detect input signals in noisy environments.

The circuit of FIG. 3 is constructed so that the amount of positive feedback, and thus the contention, can actually be varied while the device is operating. This causes the circuit to behave as a variable delay cell, and the delay time depends on the value of a digital code applied to the circuit. This is accomplished by utilizing a feedback path that varies the amount of positive feedback in response to the digital code.

The circuit of FIG. 3 includes an input inverter INV1, an output inverter INV2, and two delay stacks, one of which is a composite delay stack formed from two parallel delay stacks. The first delay stack includes transistors MP1*a*, MP1*b*, MN1*a*, and MN1*b*. The second stack includes the delay stack formed from MP2*a*, MP2*b*, MN2*a*, and MN2*b* in parallel with the delay stack formed from MP3*a*, MP3*b*, MN3*a*, and MN3*b*. The channels of MP1*a* and MP1*b* are connected in series between the positive power supply terminal and a node N1 where the output terminal of INV1 and the input terminal of INV2 are connected. The channels of MP2*a* and MP2*b* are similarly connected in series between the positive power supply terminal and N1, as are the channels of MP3*a*,MP3*b*. Likewise, the channels of MN1*a*, MN1*b* are connected in series between the power supply common terminal and N1, as are the channels of MN2*a*, MN2*b* and MN3*a*, MN3*b*.

The gates of MP1*a*, MP2*a*, and MP3*a* are connected to the output of INV2 which completes one leg of the positive feedback path. The gates of MN1*a*, MN2*a*, and MN3*a* are also connected to the output of INV2 which completes another leg of the positive feedback path.

The code applied to the circuit of FIG. 3 to control the amount of feedback is a number comprising the bits b1 and b2. This code is represented by code signals b1 and b2, and their complementary signals /b1 and /b2. Although the embodiment shown in FIG. 3 utilizes a two-bit code, this can be generalized to an "n-bit" system having n stacks and utilizing an n-bit code represented by code signals b1, b2, . . . bn and their complements /b1, /b2, . . . /bn. The gates of MP1*b* and MN1*b* receive the signals b1 and /b1, respectively. The gates of MP2*b* and MP3*b* are connected together to receive the signal b2, and the gates of MN2*b* and MN3*b* are connected together to receive the signal /b2.

Figure 4:
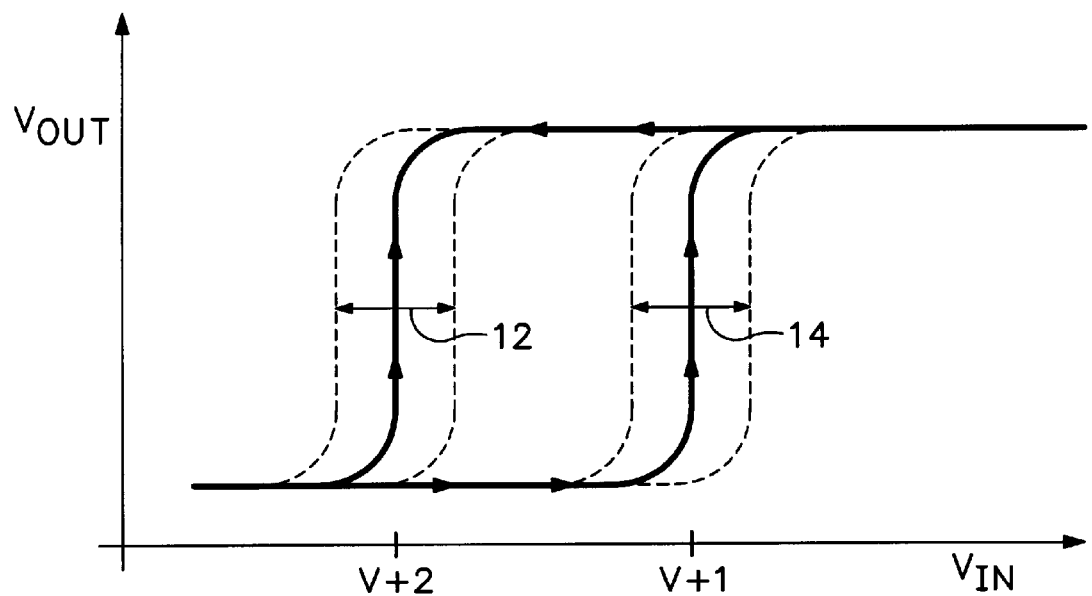
FIG. 4 is a graph that illustrates the input/output characteristics the delay cell of FIG. 3.

FIG. 4 illustrates how a code applied to the delay cell of FIG. 3 changes the hysteresis window of the delay cell. As the input voltage Vin increases, the output voltage Vout remains constant at a low logic level until Vin reaches a first trigger level Vt1. Vout then rises to a high logic level. As the input voltage Vin decreases, Vout remains high until Vin falls to a lower trigger level Vt2, at which point, Vout falls to a low logic level. Changing the code causes the hysteresis window to change as shown by the arrows 12 and 14, thereby changing the overall signal delay of the circuit of FIG. 3. Increasing the code causes the window to become wider and the resultant delay to become longer.

An advantage of an embodiment of a delay cell constructed in accordance with the present invention, such as that shown in FIG. 3, is that it takes up only about one-tenth of the die area required for a comparable RC delay cell. A further advantage is that the delay time can be controlled more accurately, even when designed for very small delays.

In a preferred embodiment, the stacks of a delay cell in accordance with the present invention are binary weighted. In the embodiment of FIG. 3, this is accomplished by making all of the transistors unit size transistors. Since the second stack is a composite stack formed from two stacks in parallel, the channel resistance of the second stack is half that of the first stack. Therefore, it essentially provides twice the positive feedback. In an n-bit system, each successive composite stack could be formed from twice the number of parallel stacks as the previous stack. Although binary weighting is advantageous, the circuit of FIG. 3 can operate with other weighting, or no weighting at all. Also, the weighting can be accomplished through other techniques such as using different size transistors.

Although the circuit of FIG. 3 illustrates an embodiment that utilizes a digital code directly to switch transistors in the feedback paths, other embodiments can utilize analog control voltages to control the amount of feedback through the transistor stacks. In such an embodiment, an additional circuit block would be needed to convert the digital code into an analog control voltage.

The circuit shown in FIG. 3 is symmetric. That is, the feedback path has two identical legs along the top and bottom of the figure. However, the feedback path need not be symmetric, and the benefits of variable feedback can be realized with only one leg, although this will produce an asymmetry in the hysteresis curve shown in FIG. 4. Also, the feedback path can be implemented with different arrangements of components other than the transistor stacks shown in FIG. 3.

The inverters INV1 and INV2 of FIG. 3 are generally intended to be implemented as classic complementary metal-oxide-semiconductor (CMOS) inverters, but the invention is not so limited. As used herein, the term inverter refers to any drive element that can be arranged with the positive feedback to cause contention, and thus hysteresis, between the input and output. The first inverter INV1 is optional, although it will usually be needed to buffer the input. The inverters can also be implemented as NAND gates to provide additional functionality. Although the embodiment shown in FIG. 3 is illustrated with metal-oxideemiconductor (MOS) field-effect transistors, other devices can be used, and the term transistor is understood to refer to any current control device, the term channel refers to its controlled current path, and the term gate refers to a terminal for controlling current flow through the controlled current path.

Figure 1:
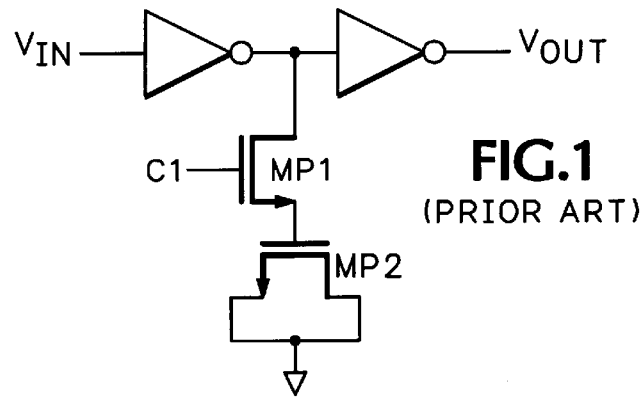
FIG. 1 is a schematic diagram of a prior art delay cell.
Figure 2:
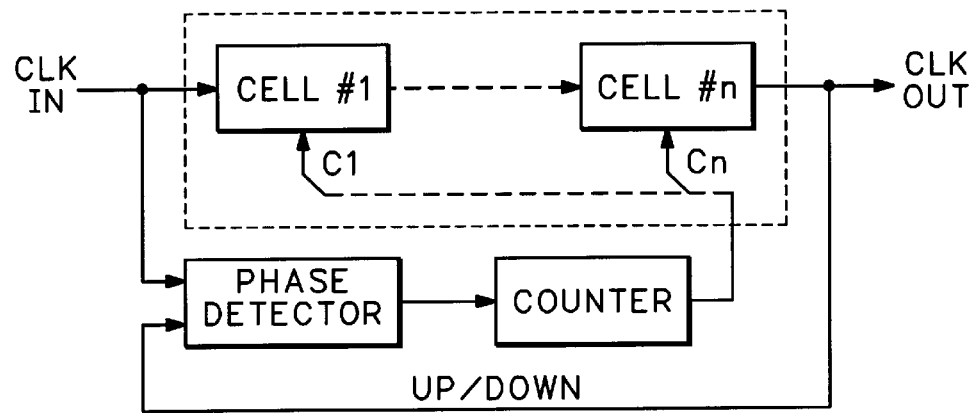
FIG. 2 is a schematic diagram of a prior art delay locked loop.

The delay cell 10 illustrated in FIG. 3 can be utilized as a "plug-in" replacement for the delay block shown in the DLL of FIG. 1 by using the code signals C1, C2, . . . Cn from the counter as the signals b1, b2, . . . bn of the delay cell of FIG. 3. The complements /b1, /b2, etc. can be generated from C1, C2, etc. using inverters, or through any other suitable technique. Although the delay cell 10 of FIG. 3 is well-suited for use in a DLL as shown in FIG. 2, the present invention is not so limited, and the delay cell of FIG. 3 can be utilized anywhere a variable delay cell is needed.

Figure 8:
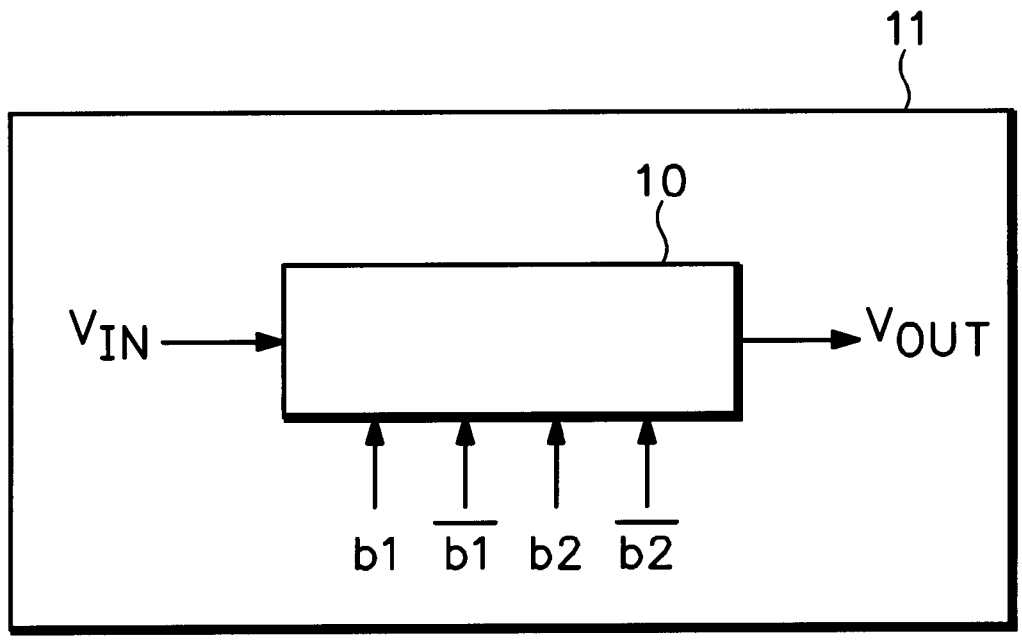
FIG. 8 is a block diagram of a semiconductor die having an embodiment of a delay cell fabricated thereon in accordance with the present invention.

An embodiment of a delay cell constructed in accordance with the present invention, such as the circuit 10 shown in FIG. 3, would typically be fabricated on a semiconductor die 11 for an integrated circuit as shown in FIG. 8. However, the invention is not so limited, and a delay cell according to the present invention can also be realized using discrete components.

Figure 5:
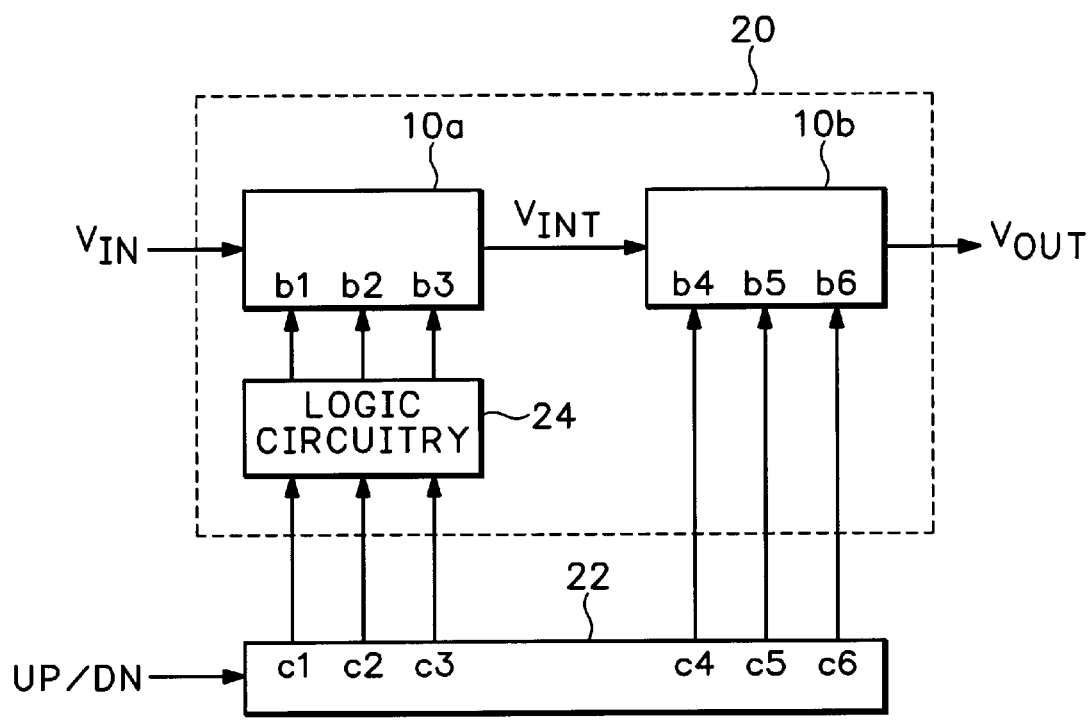
FIG. 5 is a schematic diagram of an embodiment of a delay block constructed in accordance with the present invention.

FIG. 5 shows an embodiment of a delay block 20 in accordance with the present invention. The circuit of FIG. 5 obtains a linear code-delay response from a cascade of two series-connected non-linear delay cells in which the code-delay response of one cell is modified by freezing the portion of the code used to drive that cell at a convenient code. By superpositioning the responses of the one cell having a modified code and one cell having an unmodified code, the overall response of the delay block is more linear than the response that could be obtained by just connecting two cells in series.

The delay block of FIG. 5 comprises two delay cells 10a and 10b, which are three-stack versions of the delay cell described above with respect to FIG. 3. The first delay cell 10a receives the input clock signal Vin and generates an intermediate clock signal Vint which is used as the input to the second block 10b. The delay block is driven by a 6-bit code represented by the code signals C1–C6 generated by counter 22 in response to an Up/Dn control signal. Code signals C4–C6 carry one portion of the code (the most significant bits) and are applied directly to the second delay cell 10b as the signals b1–b3 which control the delay of the cell. Code signals C1–C3 carry another portion of the code (the least significant bits) and are modified by logic circuitry 24, which, in a preferred embodiment, freezes the portion of code on C1 and C3 at a convenient value as described below.

Figure 6:
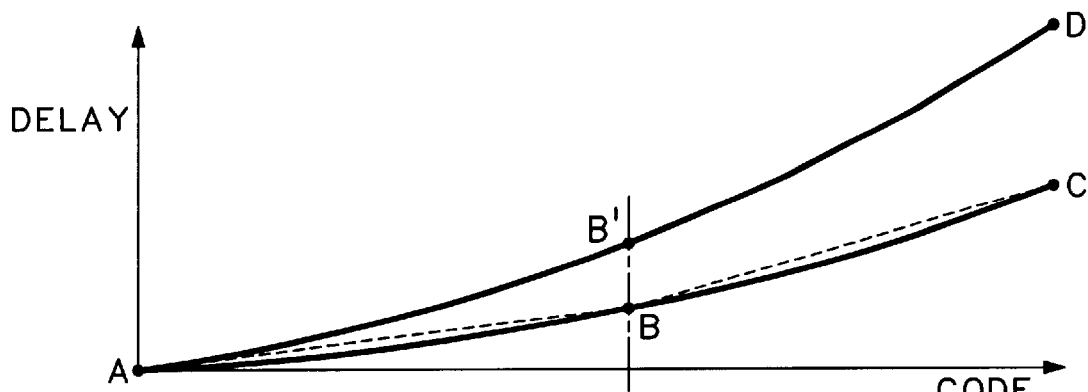
FIG. 6 is a graph that illustrates the code-delay response of the delay block of FIG. 5 if the LSB portion of the code is not modified.

The operation of the circuit of FIG. 5 will now be described with reference to FIGS. 6 and 7 which illustrate the effect of modifying the LSB portion of the code. Referring to FIG. 6, the solid curve A-B-C shows the code-delay response of the first delay cell 10a as a function of the input code. This curve can be approximated as the piecewise linear function shown in broken lines. The solid curve A-D shows the code-delay response that would be obtained from both delay cells 10a and 10b in series if the LSB portion of the code was not modified.

Figure 7:
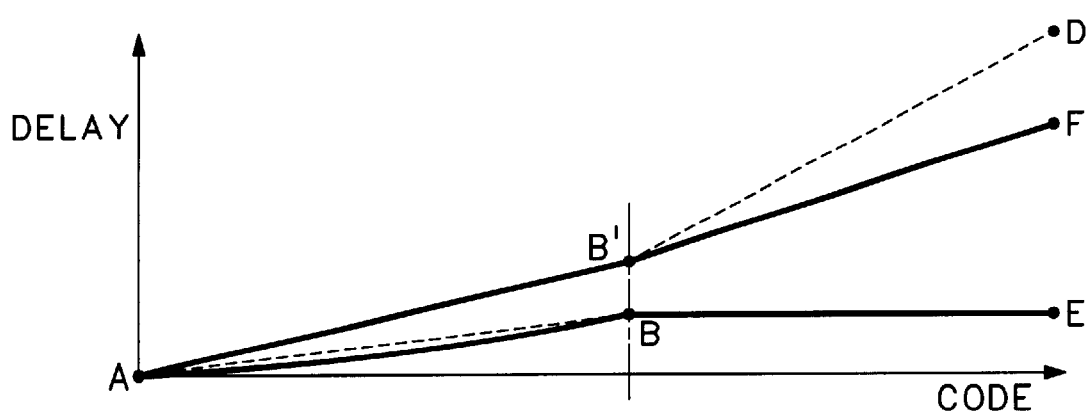
FIG. 7 is a graph that illustrates the code-delay response of the delay block of FIG. 5 when the LSB portion of the code is modified.

FIG. 7 shows the effect of modifying the LSB portion of the code. The output from the first delay cell 10a increases as shown by the solid curve A-B as the code increases. When the LSB portion of the code reaches a predetermined value, it is frozen by the logic circuitry, so the code-delay from the first cell remains constant as shown by the solid curve B-E. The code-delay response of the second delay cell is added to that of the first cell, so the overall code-delay response is as shown by the solid curve A-F. Thus, the overall response is more nearly linear than that obtained without modifying the LSB portion of the code as shown in the broken curve A-D.

A simple solution emerges when the slope of one of the two piecewise linear regions is about twice that of the other. This is a particularly elegant scheme when the partition point or code value at which the two piecewise linear regions meet is at the mid-point of the code range, i.e., where the most significant bit (MSB) of the counter switches. Although a code-delay gradient of 1:2 is preferred, the present invention is not so limited, and other ratios can be used.

As described above, an advantage of a delay block constructed in accordance with the present invention, such as that shown in FIG. 5, is that it produces a highly linear code-delay response. A further advantage is that it reduces jitter. The LSB jitter of the overall delay block when locked at the highest code in a DLL is half that of two series-connected delay cells that do not use a code modification scheme in accordance with the present invention. The LSB jitter of the delay block of FIG. 5 is almost independent of the code, i.e., it is approximately uniform across all codes. Also, the Vcc jitter of the delay block of FIG. 5 only increases linearly. In contrast, for two series-connected delay cells that do not use a code modification scheme in accordance with the present invention, both the LSB jitter and the Vcc jitter increase faster than linearly.

The logic circuitry 24 shown in FIG. 5 can be any suitable circuitry such as combinatorial and/or registered logic circuitry. The logic circuitry can be separate from the counter, or the counter can be made integral in the logic circuitry. A further advantage of the circuit of FIG. 5 is that the code can be modified by the very simple technique of rewiring a single DLL counter bit (the most significant bit (MSB)).

The delay block shown in FIG. 5 can be utilized as a "plug-in" replacement for the delay block shown in the DLL of FIG. 1. Again, the complements /b–/b3, can be generated by the logic circuitry 24, and the complements /b4–/b6 can be generated from C4–C6 using inverters or any other suitable technique.

The delay block shown in FIG. 5 can be implemented with any number of delay cells. For example, if a cascade of three series connected delay cells were used, another arrangement of logic circuitry would be needed. The first LSB portion of the code to the first delay cell would be frozen when the code reaches a first value, then the second LSB (next most significant group of bits) would be frozen when the code reaches a second value.

Figure 9:
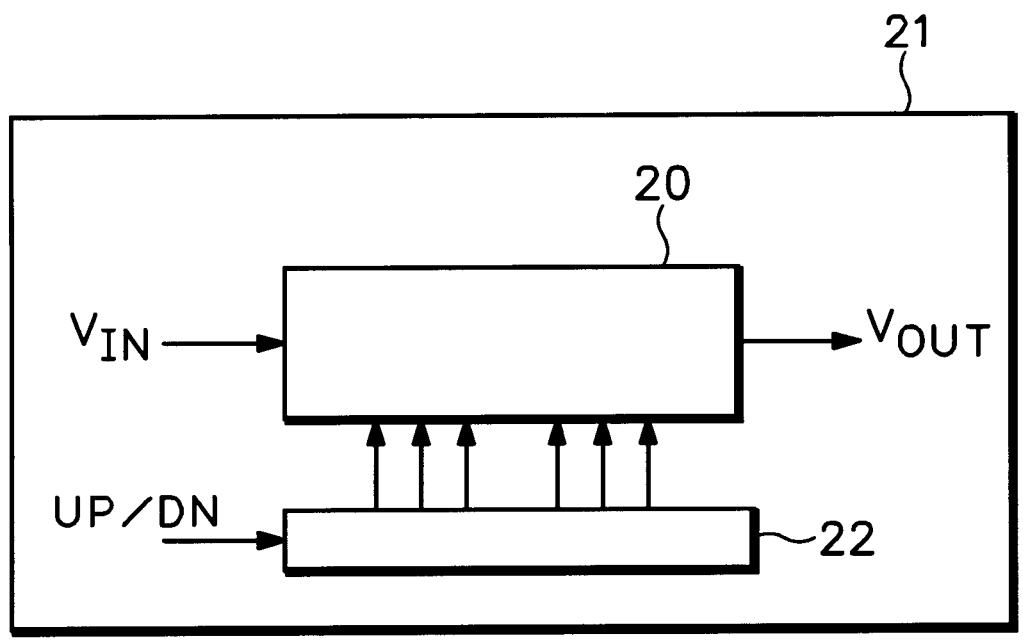
FIG. 9 is a block diagram of a semiconductor die having an embodiment of a delay block fabricated thereon in accordance with the present invention.

An embodiment of a delay block constructed in accordance with the present invention, such as the circuit 20 shown in FIG. 5, would typically be fabricated on a semiconductor die 21 for an integrated circuit as shown in FIG. 9. However, the invention is not so limited, and a delay block according to the present invention can also be realized using discrete components.

Although the delay cells having variable positive feedback shown in FIG. 3 are used in a preferred embodiment, the present invention is not so limited. The delay block of FIG. 5 illustrates a superpositioning technique of general applicability for obtaining a composite code-delay response from a cascade of any type of delay cells by modifying a portion of the code transmitted to one of the cells.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A delay cell comprising:
   an inverter having an input terminal and an output terminal; and
   feedback circuitry coupled between the input terminal and the output terminal, wherein the feedback circuitry is constructed to control the amount of feedback responsive to a code;
   wherein the feedback circuitry comprises a first leg arranged to control a first current path between the input terminal and a first power supply terminal responsive to the code and an output signal from the inverter, and a second leg arranged to control a second current path between the input terminal and a second power supply terminal responsive to the code and the output signal from the inverter.

2. A delay cell according to claim 1 wherein the feedback circuit is symmetric.

3. A delay cell comprising:
   an inverter having an input terminal and an output terminal; and
   feedback circuitry coupled between the input terminal and the output terminal, wherein the feedback circuitry is constructed to control the amount of feedback responsive to a code;
   wherein the feedback circuitry comprises a delay stack coupled between the input terminal and the output terminal.

4. A delay cell according to claim 3 wherein the feedback circuitry further comprises a second delay stack coupled between the input terminal and the output terminal.

5. A delay cell comprising:
   an inverter having an input terminal and an output terminal; and
   feedback circuitry coupled between the input terminal and the output terminal, wherein the feedback circuitry is constructed to control the amount of feedback responsive to a code;
   wherein the feedback circuitry comprises a delay stack coupled between the input terminal and the output terminal; and
   wherein:
      the delay stack comprises first and second transistors having channels coupled in series between the input terminal and a first power supply terminal;
      the first transistor has a gate coupled to the output terminal;
      the code is represented by a first code signal; and
      the second transistor has a gate for receiving the first code signal.

6. A delay cell according to claim 5 wherein:
   the delay stack further comprises third and fourth transistors having channels coupled in series between the input terminal and a second power supply terminal;
   the fourth transistor has a gate coupled to the output terminal;
   the code is further represented by a complement of the first code signal; and
   the second transistor has a gate for receiving the complement of the first code signal.

7. A delay cell comprising:
   an inverter having an input terminal and an output terminal; and
   feedback circuitry coupled between the input terminal and the output terminal, wherein the feedback circuitry is constructed to control the amount of feedback responsive to a code;
   wherein the feedback circuitry comprises a delay stack coupled between the input terminal and the output terminal;
   wherein the feedback circuitry further comprises a second delay stack coupled between the input terminal and the output terminal; and wherein the first and second delay stacks are binary weighted.

8. A delay cell comprising:

an inverter having an input terminal and an output terminal; and feedback circuitry coupled between the input terminal and the output terminal, wherein the feedback circuitry is constructed to control the amount of feedback responsive to a code;

wherein the feedback circuitry comprises a delay stack coupled between the input terminal and the output terminal;

wherein the feedback circuitry further comprises a second delay stack coupled between the input terminal and the output terminal; and wherein the second delay stack is a composite delay stack comprising two delay stacks arranged in parallel.

9. A delay cell according to claim 8 wherein the first delay stack and the two delay stacks comprising the second delay stack are comprised of unit sized transistors.

10. A delay cell comprising:

an inverter having an input terminal and an output terminal; and feedback circuitry coupled between the input terminal and the output terminal, wherein the feedback circuitry is constructed to control the amount of feedback responsive to a code;

wherein the feedback circuitry comprises a delay stack coupled between the input terminal and the output terminal;

wherein the feedback circuitry further comprises a second delay stack coupled between the input terminal and the output terminal; and wherein:

the digital code comprises a first code signal and a second code signal;

the first delay stack is arranged to operate responsive to the first code signal; and the second delay stack is arranged to operate responsive to the second code signal.

11. A delay locked loop comprising:

a delay block for generating an output clock signal responsive to an input clock signal and a code;

a phase detector coupled to the delay block for generating a control signal responsive to the input clock signal and the output clock signal; and a counter coupled between the phase detector and the delay block for generating the code responsive to the control signal;

wherein the delay block comprises a delay cell comprising:

an inverter having an input terminal and an output terminal; and feedback circuitry coupled between the input terminal and the output terminal, wherein the feedback circuitry is constructed to control the amount of feedback responsive to the code.

12. A delay looked loop according to claim 11 wherein the delay block further comprises a second delay cell coupled to the first delay cell in a cascade arrangement, and wherein the second delay cell comprises:

a second inverter having an input terminal and an output terminal; and second feedback circuitry coupled between the input terminal and the output terminal of the second inverter, wherein the second feedback circuitry is constructed to control the amount of feedback to the second inverter responsive to the code.

13. A delay looked loop according to claim 12 wherein:

the first delay cell is coupled to receive a first portion of the code; the second delay cell is coupled to receive a second portion of the code; and the counter is constructed to freeze the first portion of the code when the code reaches a predetermined value.

14. A delay locked loop comprising:

a delay block for generating an output clock signal responsive to an input clock signal and a code;

a phase detector coupled to the delay block for generating a control signal responsive to the input clock signal and the output clock signal; and a counter coupled between the phase detector and the delay block for generating the code responsive to the control signal;

wherein the delay block comprises a delay cell comprising:

an inverter having an input terminal and an output terminal; and feedback circuitry coupled between the input terminal and the output terminal, wherein the feedback circuitry is constructed to control the amount of feedback responsive to the code;

wherein the delay block further comprises a second delay cell coupled to the first delay cell in a cascade arrangement, and wherein the second delay cell comprises:

a second inverter having an input terminal and an output terminal; and second feedback circuitry coupled between the input terminal and the output terminal of the second inverter, wherein the second feedback circuitry is constructed to control the amount of feedback to the second inverter responsive to the code; and wherein:

the code is represented by a first, second, third and fourth code signals;

the first feedback circuitry comprises:

a first delay stack coupled between the input and output terminals of the first inverter, and coupled to receive the first code signal, and a second delay stack coupled between the input and output terminals of the first inverter, and coupled to receive the second code signal; and the second feedback circuitry comprises:

a third delay stack coupled between the input and output terminals of the second inverter, and coupled to receive the third code signal, and a fourth delay stack coupled between the input and output terminals of the second inverter, and coupled to receive the fourth code signal.

15. A delay locked loop according to claim 14 wherein the second and fourth delay stacks are composite delay stacks, each comprising two delay stacks coupled in parallel.

16. A delay block comprising:

a plurality of delay cells coupled in a cascade arrangement for generating an output clock signal responsive to an input clock signal and a code;

logic circuitry coupled to the plurality of delay cells for transmitting a portion of the code to each of the delay cells, wherein the logic circuitry is constructed so as to modify one of the portions of the code as the code changes.

17. A delay block according to claim 16 wherein:

the plurality of delay cells comprises a first delay cell coupled to the logic circuitry to receive a least significant portion of the code; and the logic circuitry is constructed so as to freeze the least significant portion of the code when the code reaches a predetermined value.

18. A delay block according to claim 17 wherein:

the plurality of delay cells comprises a second delay cell coupled to the logic circuitry to receive a second least significant portion of the code; and the logic circuitry is constructed so as to freeze the second least significant portion of the code when the code reaches a second predetermined value.

19. A delay block according to claim 18 wherein the plurality of delay cells comprises a third delay cell coupled to the logic circuitry to receive a portion of the code.

20. A delay block according to claim 16 wherein the logic circuitry comprises a counter for generating the code responsive to a control signal.

21. A delay locked loop comprising:

a delay block for generating an output clock signal responsive to an input clock signal and a code;

a phase detector coupled to the delay block for generating a control signal responsive to the input clock signal and the output clock signal; and a counter coupled between the phase detector and the delay block for generating the code responsive to the control signal;

wherein the delay block comprises:
a plurality of delay cells coupled in a cascade arrangement for generating the output clock signal responsive to the input clock signal and the code;
logic circuitry coupled to the plurality of delay cells and the counter for transmitting a portion of the code to each of the delay cells, wherein the logic circuitry is constructed so as to modify one of the portions of the code as the code changes.

22. A delay locked loop according to claim 21 wherein:

the plurality of delay cells comprises a first delay cell coupled to the logic circuitry to receive a least significant portion of the code; and the logic circuitry is constructed so as to freeze the least significant portion of the code when the code reaches a predetermined value.

23. A delay locked loop according to claim 22 wherein:

the plurality of delay cells comprises a second delay cell coupled to the logic circuitry to receive a second least significant portion of the code; and the logic circuitry is constructed so as to freeze the second least significant portion of the code when the code reaches a second predetermined value.

24. A delay locked loop according to claim 21 wherein the counter is integral with the logic circuitry.

25. A semiconductor die having a delay cell fabricated thereon, the delay cell comprising:

an inverter having an input terminal and an output terminal; and feedback circuitry coupled between the input terminal and the output terminal, wherein the feedback circuitry is constructed to control the amount of feedback responsive to a code;
wherein the feedback circuitry comprises a first leg arranged to control a first current path between the input terminal and a first power supply terminal responsive to the code and an output signal from the inverter, and a second leg arranged to control a second current path.

26. A semiconductor die according to claim 25 wherein the feedback circuitry comprises a delay stack coupled between the input terminal and the output terminal.

27. A semiconductor die according to claim 26 wherein the circuitry further comprises a second delay stack coupled between the input terminal and the output terminal.

28. A semiconductor die having a delay cell fabricated thereon, the delay cell comprising:

an inverter having an input terminal and an output terminal; and feedback circuitry coupled between the input terminal and the output terminal, wherein the feedback circuitry is constructed to control the amount of feedback responsive to a code;
wherein the feedback circuitry comprises a delay stack coupled between the input terminal and the output terminal; and
wherein:
the delay stack comprises first and second transistors having channels coupled in series between the input terminal and a first power supply terminal;
the first transistor has a gate coupled to the output terminal;
the code is represented by a first code signal; and
the second transistor has a gate for receiving the first code signal.

29. A semiconductor die having a delay block fabricated thereon, the delay block comprising:

a plurality of delay cells coupled in a cascade arrangement for generating an output clock signal responsive to an input clock signal and a code;

logic circuitry coupled to the plurality of delay cells for transmitting a portion of the code to each of the delay cells, wherein the logic circuitry is constructed so as to modify one of the portions of the code as the code changes.

30. A semiconductor die according to claim 29 wherein:

the plurality of delay cells comprises a first delay cell coupled to the logic circuitry to receive a least significant portion of the code; and the logic circuitry is constructed so as to freeze the least significant portion of the code when the code reaches a predetermined value.

31. A semiconductor die according to claim 30 wherein:

the plurality of delay cells comprises a second delay cell coupled to the logic circuitry to receive a second least significant portion of the code; and the logic circuitry is constructed so as to freeze the second least significant portion of the code when the code reaches a second predetermined value.

32. A delay cell comprising:

an inverter having an input terminal and an output terminal; and feedback circuitry coupled between the input terminal and the output terminal, wherein the feedback circuitry is constructed to control the amount of feedback responsive to a code;
wherein the feedback circuitry comprises a first leg having a first resistance and a second leg having a second resistance; and
wherein the first and second resistances are asymmetric.

* * * * *

UNITED STATES PATENT AND TRADEMARK OFFICE
CERTIFICATE OF CORRECTION

PATENT NO. : 6,417,714 B1
DATED : July 9, 2002
INVENTOR(S) : Ahmed Biyabani and Krishnamurthy Soumyanath It is certified that error appears in the above-identified patent and that said Letters Patent is hereby corrected as shown below:

Title page,
Item [73], Assignee "Inter Corporation" should read -- Intel Corporation --.

Column 3,
Line 60, "oxideemiconductor" should read -- oxide-semiconductor --

Column 10,
Line 61, "circuitry" should read -- circuit --.

Signed and Sealed this

Eleventh Day of February, 2003

JAMES E. ROGAN
*Director of the United States Patent and Trademark Office*